United States Patent
Ichikawa et al.

(10) Patent No.: US 8,212,261 B2
(45) Date of Patent: Jul. 3, 2012

(54) SIC SEMICONDUCTOR DEVICE WITH BPSG INSULATION FILM

(75) Inventors: Hiroyuki Ichikawa, Toyota (JP); Hideki Kawahara, Kariya (JP); Hiroki Nakamura, Handa (JP)

(73) Assignee: DENSO CORPORATION, Kariya (JP)

( * ) Notice: Subject to any disclaimer, the term of this patent is extended or adjusted under 35 U.S.C. 154(b) by 354 days.

(21) Appl. No.: 12/153,031

(22) Filed: May 13, 2008

(65) Prior Publication Data
US 2008/0315211 A1 Dec. 25, 2008

(30) Foreign Application Priority Data
Jun. 21, 2007 (JP) ................................ 2007-164093

(51) Int. Cl.
*H01L 29/10* (2006.01)
(52) U.S. Cl. ............ 257/77; 257/E29.104; 257/E21.065; 257/E21.054; 438/602
(58) Field of Classification Search .................... 257/77, 257/335, E21.065, E29.297, 587, E21.054, 257/E29.104; 438/273, 571, 586, 602, 931
See application file for complete search history.

(56) References Cited

U.S. PATENT DOCUMENTS

| | | | | |
|---|---|---|---|---|
| 5,510,281 A * | 4/1996 | Ghezzo et al. | ............... | 438/268 |
| 5,814,859 A * | 9/1998 | Ghezzo et al. | ............... | 257/335 |
| 5,851,860 A * | 12/1998 | Makita et al. | ............... | 438/166 |
| 6,218,254 B1 * | 4/2001 | Singh et al. | ............... | 438/364 |
| 6,919,636 B1 * | 7/2005 | Ryan | ............... | 257/751 |
| 6,962,855 B2 * | 11/2005 | Kim et al. | ............... | 438/409 |
| 6,975,004 B2 * | 12/2005 | Sander | ............... | 257/392 |
| 7,015,150 B2 * | 3/2006 | Cooney et al. | ............... | 438/765 |
| 7,157,370 B2 * | 1/2007 | Inoue et al. | ............... | 438/637 |
| 7,541,679 B2 * | 6/2009 | Cooney et al. | ............... | 257/758 |
| 7,564,136 B2 * | 7/2009 | Yeh et al. | ............... | 257/773 |
| 2002/0031875 A1 * | 3/2002 | Parekh et al. | ............... | 438/156 |
| 2003/0107041 A1 | 6/2003 | Tanimoto et al. | | |
| 2005/0142674 A1 * | 6/2005 | Takahashi et al. | ............... | 438/18 |
| 2007/0045631 A1 | 3/2007 | Endo et al. | | |

FOREIGN PATENT DOCUMENTS

JP  A-2005-276978  10/2005

OTHER PUBLICATIONS

European Search Report issued by the European Patent Office on May 4, 2009 in connection with European patent application No. 08009285.1-2203.
Lee et al., "On the Ni-Si phase transformation with/without native oxide," (2000), *Microelectronic Engineering 51-52*, pp. 583-594.
European Examination Report dated Jan. 11, 2012 in corresponding EP Application No. 08009285.1.

* cited by examiner

*Primary Examiner* — William F Kraig
(74) *Attorney, Agent, or Firm* — Posz Law Group, PLC

(57) ABSTRACT

A SiC device includes: a substrate; a drift layer; a base region; a source region; a channel layer connecting the drift layer and the source region; a gate oxide film on the channel layer and the source region; a gate electrode on the gate oxide film; an interlayer insulation film with a contact hole having a barrier layer and a BPSG insulation film on the gate electrode; a source electrode having upper and lower wiring electrodes on the interlayer insulation film and in the contact hole for connecting the base region and the source region; and a drain electrode on the substrate. The barrier layer prevents a Ni component in the lower wiring electrode from being diffused into the BPSG insulation film.

14 Claims, 8 Drawing Sheets

SIC SEMICONDUCTOR DEVICE WITH BPSG INSULATION FILM

CROSS REFERENCE TO RELATED APPLICATION

This application is based on Japanese Patent Application No. 2007-164093 filed on Jun. 21, 2007, the disclosure of which is incorporated herein by reference.

FIELD OF THE INVENTION

The present invention relates to a SiC semiconductor device with a BPSG insulation film and a method for manufacturing a SiC semiconductor device with a BPSG insulation film.

BACKGROUND OF THE INVENTION

A silicon carbide (i.e., SiC) semiconductor device may have a MOS structure similar to a silicon semiconductor device. For example, US Patent Application Publication No. 2007/0045631-A1 teaches a vertical power MOSFET as a SiC semiconductor device. This MOSFET includes an interlayer insulation film made of a LTO film, which is formed on a surface of a gate electrode. In this case, the LTO film may have a crack or a failure in shape, so that an electrode wiring disposed on the LTO film may be disconnected or the electrode wiring and the gate electrode may short-circuit. Accordingly, the MOSFET may have a gate leakage failure. Therefore, the interlayer insulation film is made of a BPSG insulation film, which is also used for the silicon semiconductor device. In such a case, by performing an anneal process, a boron softening effect generates so that the crack failure and the failure in shape are prevented.

In the vertical power MOSFET, a source electrode as an upper electrode contacts a N+ source region with ohmic contact. The source region is made of N type semiconductor. Thus, the source electrode is made of material having ohmic contact with the N type semiconductor, for example, made of Ni. Therefore, the material such as Ni is diffused in the BPSG insulation film.

The inventors preliminarily studied diffusion of a Ni component in a Ni source electrode into a BPSG insulation film, as a related art. FIG. 7 shows a result of SIMS analysis of a Ni concentration in the BPSG insulation film. The Ni atoms are diffused from a contact portion between the BPSG insulation film and the Ni source electrode.

When a component of the source electrode is diffused in the BPSG insulation film, the insulating property of the BPSG insulation film is reduced. For example, FIG. 8 shows a relationship between a drain voltage VD and a drain current ID in case of Ni diffusion in the BPSG insulation film and in case of no diffusion in the BPSG insulation film. VIIIA represents a case where the Ni atoms are diffused in the BPSG insulation film, and VIIIB represents a case where the Ni atoms are not diffused in the BPSG insulation film. When the Ni atoms are diffused in the BPSG insulation film, the drain current ID rapidly increases at the drain voltage VD of 200 volts. Accordingly, the insulation breakdown voltage is about 200 volts, which is much smaller than that in a case where the Ni atoms are not diffused in the BPSG insulation film. When the Ni atoms are not diffused in the BPSG insulation film, the drain current ID rapidly increases at the drain voltage VD of the 700 volts. Thus, the insulation breakdown voltage is about 700 volts. To reduce the influence of the Ni diffusion in the BPSG insulation film, it is considered that a thickness of the BPSG insulation film is increased. However, in this case, a process time in a forming step of the BPSG insulation film becomes longer. Further, an etching time in a step for forming a contact hole in the BPSG insulation film becomes longer. Accordingly, it is preferable to reduce the influence of the Ni component diffusion in the BPSG insulation film having a small thickness.

SUMMARY OF THE INVENTION

In view of the above-described problem, it is an object of the present disclosure to provide a SiC semiconductor device with a BPSG insulation film. It is another object of the present disclosure to provide a method for manufacturing a SiC semiconductor device with a BPSG insulation film.

According to a first aspect of the present disclosure, a SiC semiconductor device includes: a substrate made of SiC and having first and second sides; a drift layer made of SiC, having a N conductive type, and disposed on the first side of the substrate; a base region having a P conductive type, and disposed in a surface portion of the drift layer; a source region made of SiC, having the N conductive type, disposed in the base region, wherein an impurity concentration of the source region is higher than the drift layer; a channel layer made of SiC, having the N conductive type, and disposed on the base region and the drift layer, wherein the channel layer connects the drift layer and the source region; a gate oxide film disposed on the channel layer and the source region; a gate electrode disposed on the gate oxide film; an interlayer insulation film disposed on the gate electrode, wherein the interlayer insulation film includes a contact hole, which connects to the base region and the source region; a source electrode disposed in the contact hole of the interlayer insulation film so that the source electrode is electrically coupled with the base region and the source region; and a drain electrode disposed on the second side of the substrate. The channel layer provides a channel, which is controllable with a voltage applied to the gate electrode. The channel provides a current flowing between the source electrode and the drain electrode through the source region, the channel and the drift layer. The source electrode includes a lower wiring electrode and an upper wiring electrode. The lower wiring electrode is made of material including a Ni component for providing ohmic contact with respect to a N conductive type semiconductor. The lower wiring electrode is disposed on the interlayer insulation film. The lower wiring electrode is electrically coupled with the source region. The upper wiring electrode is made of material for providing ohmic contact with respect to a P conductive type semiconductor. The upper wiring electrode is disposed on the lower wiring electrode. The upper wiring electrode is electrically coupled with the base region. The interlayer insulation film further includes a BPSG insulation film and a barrier layer. The BPSG insulation film is disposed on the gate electrode. The barrier layer is disposed on the BPSG insulation film and provides a sidewall of the contact hole of the interlayer insulation film. The barrier layer prevents the Ni component in the lower wiring electrode from being diffused into the BPSG insulation film.

In the above device, the BPSG insulation film does not contact the lower wiring electrode in the source electrode. Therefore, the Ni component in the lower wiring electrode is prevented from being diffused into the BPSG insulation film.

According to a second aspect of the present disclosure, a SiC semiconductor device includes: a substrate made of SiC and having first and second sides; a drift layer made of SiC, having a N conductive type, and disposed on the first side of the substrate; a base region having a P conductive type, and disposed in a surface portion of the drift layer; a source region made of SiC, having the N conductive type, disposed in the base region, wherein an impurity concentration of the source region is higher than the drift layer; a gate oxide film disposed on the drift layer, the base region and the source region; a gate electrode disposed on the gate oxide film; an interlayer insulation film disposed on the gate electrode, wherein the interlayer insulation film includes a contact hole, which connects to the base region and the source region; a source electrode disposed in the contact hole of the interlayer insulation film so that the source electrode is electrically coupled with the base region and the source region; and a drain electrode disposed on the second side of the substrate. A part of the base region facing the gate electrode through the gate insulation film provides a channel, which is controllable with a voltage applied to the gate electrode. The channel provides a current flowing between the source electrode and the drain electrode through the source region, the channel and the drift layer. The source electrode includes a lower wiring electrode and an upper wiring electrode. The lower wiring electrode is made of material including a Ni component for providing ohmic contact with respect to a N conductive type semiconductor. The lower wiring electrode is disposed on the interlayer insulation film. The lower wiring electrode is electrically coupled with the source region. The upper wiring electrode is disposed on the lower wiring electrode. The upper wiring electrode is electrically coupled with the base region. The interlayer insulation film further includes a BPSG insulation film and a barrier layer. The BPSG insulation film is disposed on the gate electrode. The barrier layer is disposed on the BPSG insulation film and provides a sidewall of the contact hole of the interlayer insulation film. The barrier layer prevents the Ni component in the lower wiring electrode from being diffused into the BPSG insulation film.

In the above device, the BPSG insulation film does not contact the lower wiring electrode in the source electrode. Therefore, the Ni component in the lower wiring electrode is prevented from being diffused into the BPSG insulation film.

According to a third aspect of the present disclosure, a method for manufacturing a SiC semiconductor device includes: forming a drift layer on a first side of a substrate, wherein the substrate is made of SiC, and wherein the drift layer is made of SiC and has a N conductive type; forming a base region in a surface portion of the drift layer, wherein the base region has a P conductive type; forming a channel layer on the base region and the drift layer, wherein the channel layer is made of SiC and has the N conductive type; forming a source region in the base region by implanting a N conductive type impurity ion in the base region through the channel layer, wherein an impurity concentration of the source region is higher than the drift layer; forming a gate oxide film on the channel layer and the source region; forming a gate electrode on the gate oxide film; forming a BPSG film on the gate electrode; forming a contact hole in the BPSG film, wherein the contact hole connects to the base region and the source region; forming a barrier layer in the contact hole and on the BPSG film, wherein the BPSG film and the barrier layer provides an interlayer insulation film, and wherein the barrier layer is made of an insulation film and prevents a Ni component diffusion; removing a part of the barrier layer in the contact hole so that the source region is exposed from the barrier layer; forming a drain electrode on a second side of the substrate; forming a lower wiring electrode in the contact hole and on the interlayer insulation film, wherein the lower wiring electrode is electrically coupled with the source region; and wherein the lower wiring electrode is made of material for providing ohmic contact with respect to a N conductive type semiconductor; and forming an upper wiring electrode on the lower wiring electrode, wherein the upper wiring electrode is electrically coupled with the base region, and wherein the upper wiring electrode is made of material for providing ohmic contact with respect to a P conductive type semiconductor. The lower wiring electrode and the upper wiring electrode provide a source electrode.

In the above method, the BPSG insulation film does not contact the lower wiring electrode in the source electrode. Therefore, the Ni component in the lower wiring electrode is prevented from being diffused into the BPSG insulation film.

According to a fourth aspect of the present disclosure, a method for manufacturing a SiC semiconductor device includes: forming a drift layer on a first side of a substrate, wherein the substrate is made of SiC, and wherein the drift layer is made of SiC and has a N conductive type; forming a base region in a surface portion of the drift layer, wherein the base region has a P conductive type; forming a source region in the base region by implanting a N conductive type impurity ion in the base region, wherein an impurity concentration of the source region is higher than the drift layer; forming a gate oxide film on the source region; forming a gate electrode on the gate oxide film; forming a BPSG film on the gate electrode; forming a contact hole in the BPSG film, wherein the contact hole connects to the base region and the source region; forming a barrier layer in the contact hole and on the BPSG film, wherein the BPSG film and the barrier layer provides an interlayer insulation film, and wherein the barrier layer is made of an insulation film and prevents a Ni component diffusion; removing a part of the barrier layer in the contact hole so that the source region is exposed from the barrier layer; forming a drain electrode on a second side of the substrate; forming a lower wiring electrode in the contact hole and on the interlayer insulation film, wherein the lower wiring electrode is electrically coupled with the source region; and wherein the lower wiring electrode is made of material for providing ohmic contact with respect to a N conductive type semiconductor; and forming an upper wiring electrode on the lower wiring electrode, wherein the upper wiring electrode is electrically coupled with the base region, and wherein the upper wiring electrode is made of material for providing ohmic contact with respect to a P conductive type semiconductor. The lower wiring electrode and the upper wiring electrode provide a source electrode.

In the above method, the BPSG insulation film does not contact the lower wiring electrode in the source electrode. Therefore, the Ni component in the lower wiring electrode is prevented from being diffused into the BPSG insulation film.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
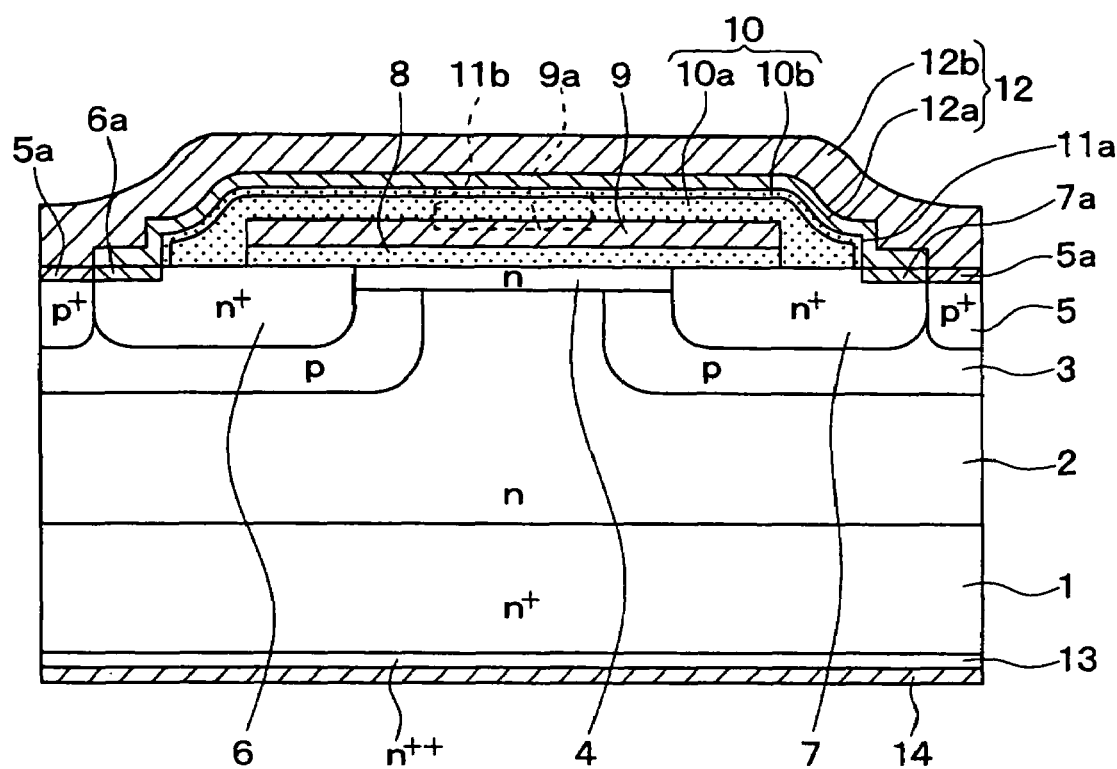
FIG. 1 is a cross sectional view showing a planar MOSFET in a SiC semiconductor device.

A SiC semiconductor device according to an example embodiment includes an accumulation type planar MOSFET. FIG. 1 shows the planar MOSFET.

The SiC semiconductor device includes a substrate 1 having a principal surface and a thickness of 300 μm. The substrate 1 is made of N+ conductive type SiC. The planar MOSFET and an outer periphery region are formed in the substrate 1. Specifically, the substrate 1 is made of 4H—SiC, has a (11-20)-oriented surface as a principal surface, and has an impurity concentration of $1 \times 10^{19}$ cm$^{-3}$. The N conductive type impurity in the substrate 1 is, for example, phosphorus.

An N conductive type drift layer 2 made of SiC is epitaxially grown on the principal surface of the substrate 1. The drift layer 2 has an impurity concentration of, for example, $5 \times 10^{15}$ cm$^{-3}$, and a thickness of 10 μm. The N conductive type impurity in the drift layer 2 is, for example, phosphorus.

Multiple P conductive type base regions 3 are formed in the surface portion of the drift layer 2. The base regions 3 are spaced apart from each other by a predetermined distance. The base regions 3 are formed by an ion implantation method, and have an impurity concentration in a range between $1 \times 10^{18}$ cm$^{-3}$ and $2 \times 10^{19}$ cm$^{-3}$.

A surface channel layer 4 provided by an N conductive type epitaxial layer is formed on the base regions 3. The surface channel layer 4 forms a channel region such that the channel layer 4 connects the drift layer 2 and N+ conductive type source regions 6, 7. The channel layer 4 has an impurity concentration of $1 \times 10^{16}$ cm$^{-3}$, and a thickness (i.e., a depth) of 0.3 μm.

A P+ conductive type body-P layer 5 is formed in the substrate 1 such that the body-P layer 5 penetrates the channel layer 4 and reaches the base regions 3. The body-P layer 5 has an impurity concentration of $1.0 \times 10^{21}$ cm$^{-3}$ and a depth of 0.3 μm.

The source regions 6, 7 are formed inside of the body-P layer 5 to sandwich the channel layer 4. The source regions 6, 7 are separated from each other. Each source region 6, 7 has an impurity concentration, for example, equal to or larger than $3 \times 10^{20}$ cm$^{-3}$ and a depth in a range between 0.3 μm and 0.4 μm.

The channel region is formed in a surface region of the surface channel layer 4 disposed on the base regions 3. A gate oxide film 8 having a thickness of 52 nm is formed to cover at least the channel region.

A gate electrode 9 having a predetermined pattern is formed on the surface of the gate oxide film 8. The gate electrode 9 is made of poly crystal silicon with doping an N conductive type impurity such as phosphorous.

An interlayer insulation film 10 covers the gate electrode 9 and a side of the gate oxide film 8. The interlayer insulation film 10 includes multiple layers, which are different type layers from each other. Specifically, the interlayer insulation film 10 includes a BPSG insulation film 10a as a first layer and a TEOS film 10b as a second layer. The BPSG insulation film 10a covers the gate electrode 9, and the TEOS film 10b covers the BPSG insulation film 10a. The total thickness of the interlayer insulation film 10 is determined based on a required insulation breakdown voltage. For example, the thickness of the interlayer insulation film 10 is in a range between 100 nm and 500 nm. The thickness of the TEOS film 10b is in a range between 10 nm and a few tens nanometers. Accordingly, almost all of the interlayer insulation film 10 is provided by the BPSG insulation film 10a. The TEOS film 10b as a barrier layer having a small thickness is formed on the BPSG insulation film 10a so that the TEOS film 10b protects the Ni atoms from diffusing into the BPSG insulation film 10a.

A contact hole 11a and another contact hole 11b are formed in the interlayer insulation film 10 and the gate oxide film 8. The contact hole 11a connects to the body-P layer 5 and the source regions 6, 7. The other contact hole 11b connects to the gate electrode 9. Contact portions 5a, 6a, 7a, 9a are formed in the contact holes 11a, 11b so that the contact portions 5a, 6a, 7a, 9a electrically connect to the body-P layer 5, the source regions 6, 7 and the gate electrode 9. The contact portion 5a, 6a, 7a, 9a is made of Ni or Ti/Ni. Further, a part of the source electrode 12 and a gate wiring are formed in the contact holes 11a, 11b. The source electrode 12 includes a lower wiring electrode 12a and an upper wiring electrode 12b. The lower wiring electrode 12a is made of electrode material such as Ni, which provides an ohmic contact with the contact portions 6a, 7a, 9a made of N conductive type semiconductor. The upper wiring electrode 12b is made of electrode material such as Al, which provides an ohmic contact with the contact portion 5a made of a P conductive type impurity layer.

A drain contact region 13 having a N+ conductive type and an impurity concentration higher than that of the substrate 1 is formed on a backside of the substrate 1. A drain electrode 14 as a backside electrode is formed in the drain contact region 13. The drain electrode 14 is made of Ni. Thus, the planar MOSFET is provided by the above structure.

In the MOSFET in the SiC semiconductor device, the surface channel layer 4 provides the channel region, and the channel region provides a current path. The source regions 6, 7 are arranged on an upstream side and a downstream side of the current path, respectively. By using the current path, the current flows between the source regions 6, 7 and the drain contact region 13. Further, a voltage to be applied to the gate electrode 9 is controlled, so that a width of a depletion layer formed in the channel region is controlled. Thus, the current flowing through the channel region is controlled by controlling the width of the depletion layer. Accordingly, the current flowing between the source electrode 12 and the drain electrode 14 through the source regions 6, 7 and the drain contact region 13 is controlled.

In the SiC semiconductor device, since the interlayer insulation film 10 includes the BPSG insulation film 10a and the TEOS film 10b, and the TEOS film 10b covers the BPSG insulation film 10a, the BPSG insulation film 10a does not contact the lower wiring electrode 12a in the source electrode 12. Thus, the component in the lower wiring electrode 12a that is the Ni material as ohmic material with respect to the N conductive type semiconductor is prevented from diffusing into the BPSG insulation film 10a.

Figure 2:
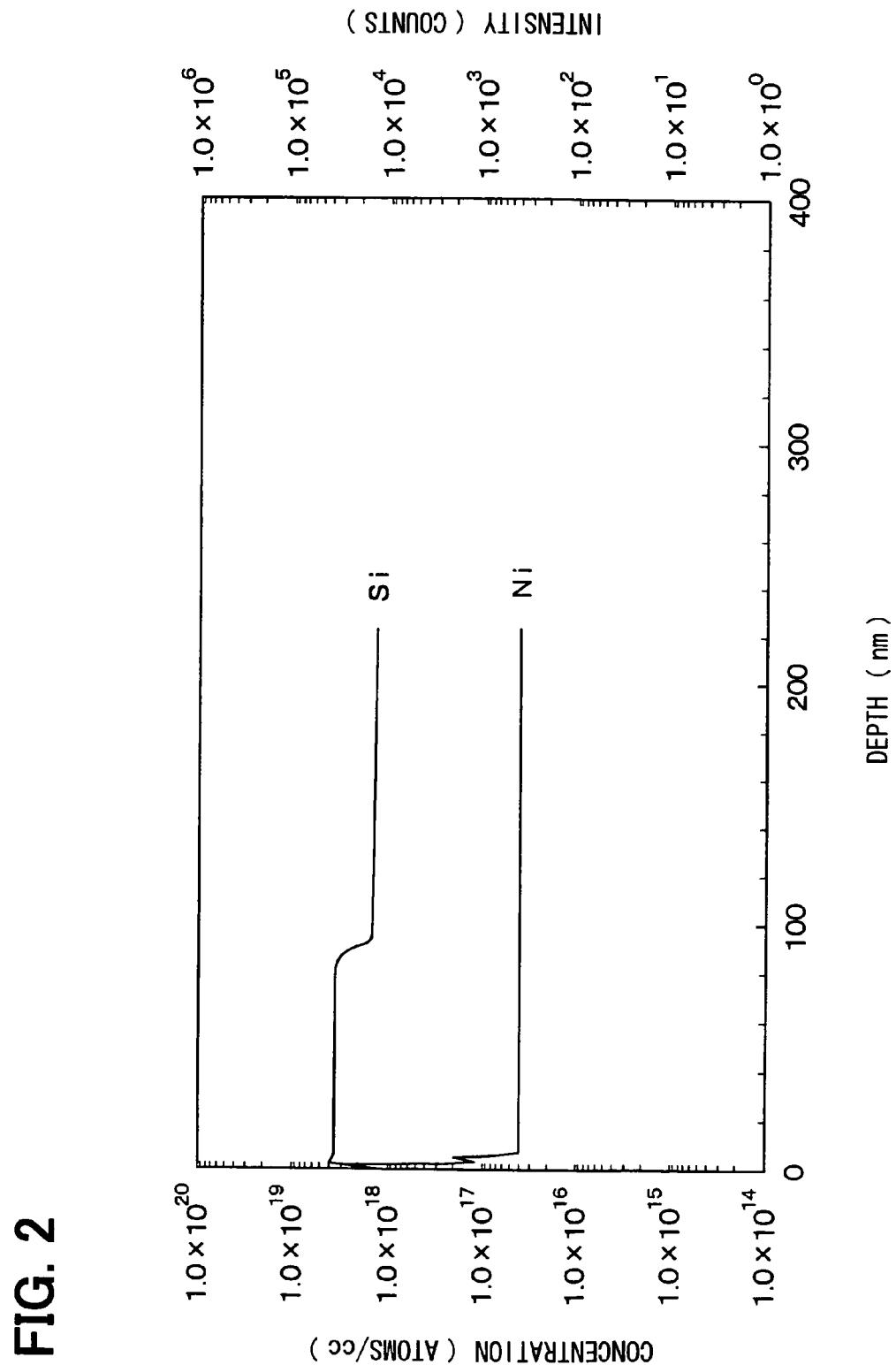
FIG. 2 is a graph showing a relationship between a depth and a concentration of Si and Ni in an interlayer insulation film.
Figure 3:
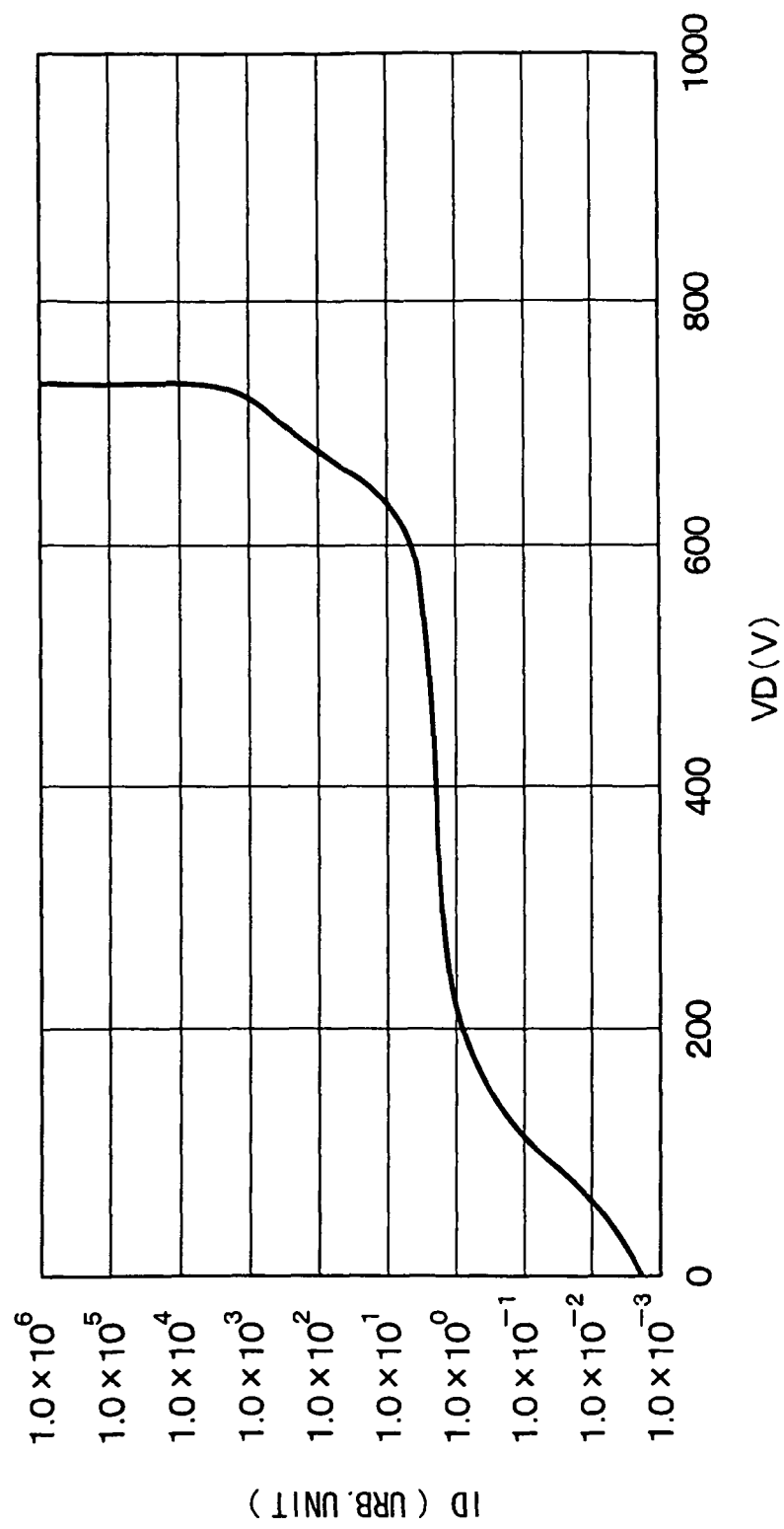
FIG. 3 is a graph showing a relationship between a drain voltage VD and a drain current ID in the planar MOSFET.
Figure 8:
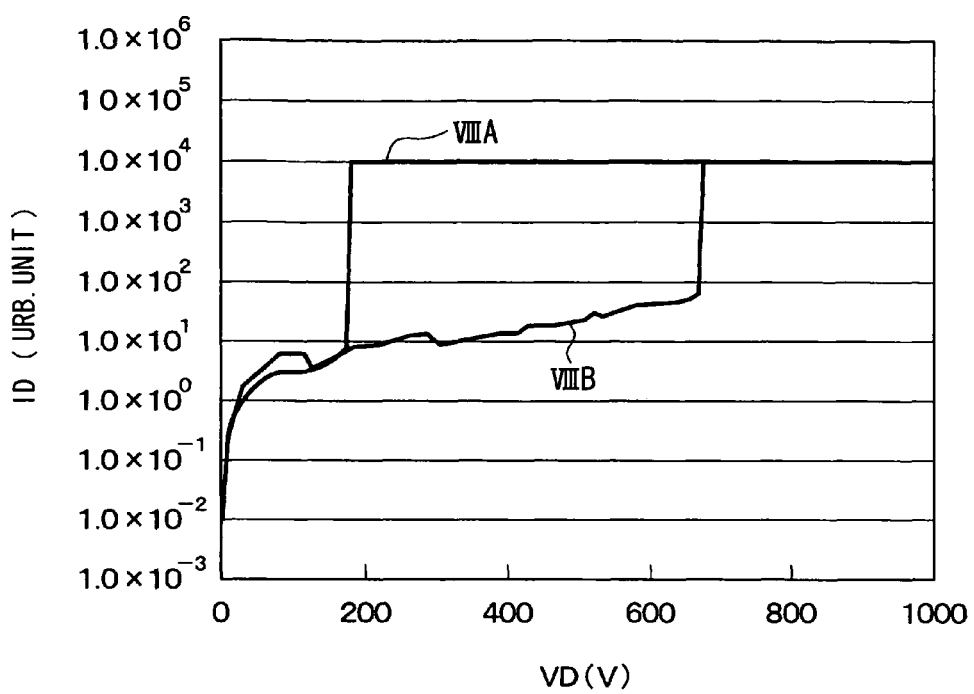
FIG. 8 is a graph showing a relationship between a drain voltage VD and a drain current ID in a MOSFET according to the related art.

FIG. 2 shows a result of a SIMS analysis for detecting Ni diffusion into the interlayer insulation film 10. Although the Ni component is diffused to the surface portion of the TEOS film 10b, the Ni component is not substantially diffused into the BPSG insulation film 10a. In this case, the relationship between the drain voltage VD and the drain current ID in this SiC semiconductor device provides a graph shown in FIG. 3. Thus, the drain voltage VD rapidly increases at about 700 volts. Thus, the insulation breakdown voltage is 700 volts. Thus, the breakdown voltage of this SiC semiconductor device is substantially equal to that of a device in a case where the Ni component diffusion is not occurred and shown in VIIIB in FIG. 8.

The thickness of the BPSG insulation film 10a and the TEOS film 10b is determined based on required insulation breakdown voltage and required Ni diffusion prevention. The thickness of the BPSG insulation film 10a sufficiently provides the required insulation breakdown voltage, and the thickness of the TEOS film 10b provides the required Ni diffusion prevention. For example, the thickness of the BPSG insulation film 10a may be equal to or larger than 100 nm, and the thickness of the TEOS film 10b may be equal to or larger than 10 nm.

To obtain the required insulation breakdown voltage without forming the TEOS film 10b, it is necessary to have the thickness of the BPSG insulation film 10a equal to or larger than 500 nm even if the Ni component is diffused into the BPSG insulation film 10a. However, in this embodiment, the TEOS film 10b protects the BPSG insulation film from Ni diffusion. Thus, even when the thickness of the BPSG insulation film 10a is 100 nm, the required insulation breakdown voltage is obtained.

As shown in FIG. 2, when the TEOS film 10b is formed on the BPSG insulation film 10a, the Ni diffusion is occurred in a range between the surface of the interlayer insulation film 10 and a depth of 10 nm. Accordingly, when the thickness of the TEOS film 10b is equal to or larger than 10 nm, the TEOS film 10b protects the BPSG insulation film 10a from Ni diffusion so that the TEOS film 10b functions as a barrier layer. In view of coverage of the TEOS film 10b on the surface of the BPSG insulation film 10a, the thickness of the TEOS film 10b may be equal to or lager than a few tens nanometers.

A method for manufacturing the SiC semiconductor device including the planar MOSFET will be explained with reference to FIGS. 4A to 6C.

Figure 4A:
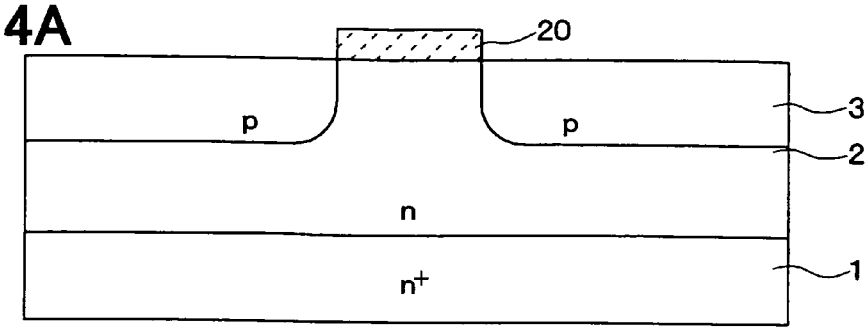
FIG. 4A to 4D are cross sectional views showing a manufacturing method for the planar MOSFET in FIG. 1.

In a step shown in FIG. 4A, the N+ conductive type substrate 1 is prepared. Then, the N conductive type drift layer 2 is formed on the principal surface of the substrate 1 by the epitaxial growth method in such a manner that the drift layer 2 has the impurity concentration of $1 \times 10^{16}$ cm$^{-3}$ and the thickness of 10 μm. Next, a mask 20 made of LTO or the like and having an opening corresponding to a base-region-to-be-formed region is formed on the surface of the drift layer 2. A P conductive type impurity ion such as an Al ion is implanted through the mask 20 on the drift layer 2.

Figure 4B:
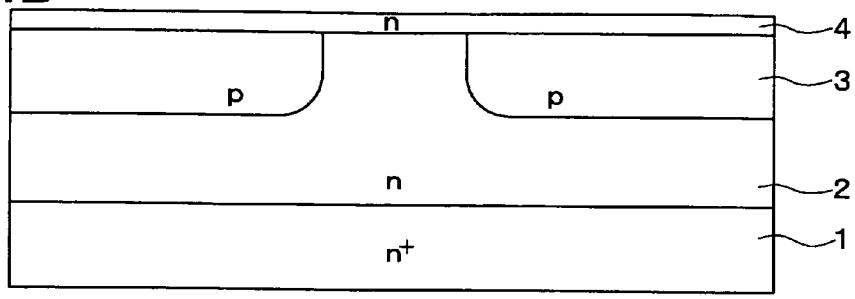

In a step shown in FIG. 4B, the surface channel layer 4 is epitaxially grown on the P conductive base region 3 such that the surface channel layer 4 has the impurity concentration of $1 \times 10^{16}$ cm$^{-3}$ and the thickness of 0.3 μm.

Figure 4C:
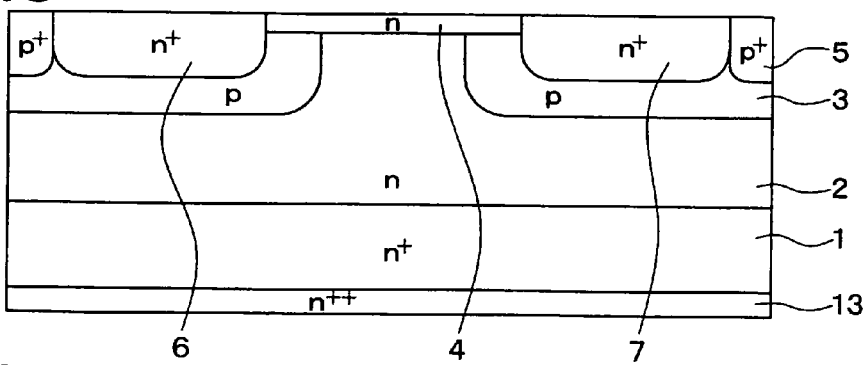

In a step shown in FIG. 4C, another LTO mask is formed, and then, an opening is formed in the LTO mask by a photo lithography method. The opening corresponds to a body-P-layer-to-be-formed region. The Al ion is implanted on the base region 3. After the LTO mask is removed, a third LTO mask is formed so that the surface of the substrate 1 is protected. The phosphorous ion is implanted on the backside of the substrate 1. Then, the third mask is removed. After that, a fourth LTO mask is formed, and then, an opening is formed in the fourth LTO mask by a photo lithography method. The opening corresponds to a source-region-to-be-formed region. After that, the N conductive type impurity ion such as a phosphorous ion is implanted. After the fourth LTO mask is removed, activation anneal at 1600° C. for 30 minutes is performed so that the implanted P conductive type impurity and the implanted N conductive type impurity are activated. Thus, the body-P layer 5, the N+ source regions 6, 7 and the drain contact region 13 are formed.

Figure 4D:
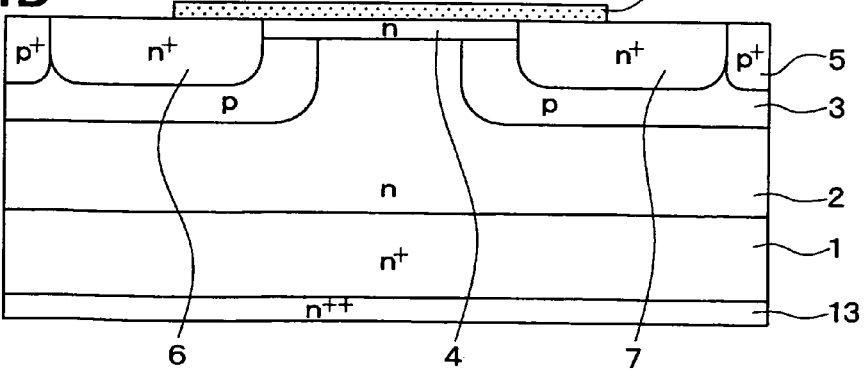

In a step shown in FIG. 4D, a gate oxide film forming step is performed, so that the gate oxide film 8 is formed. Specifically, the gate oxide film 8 is formed such that a gate oxidation by a pyrogenic method in wet atmosphere is performed.

Figure 5A:
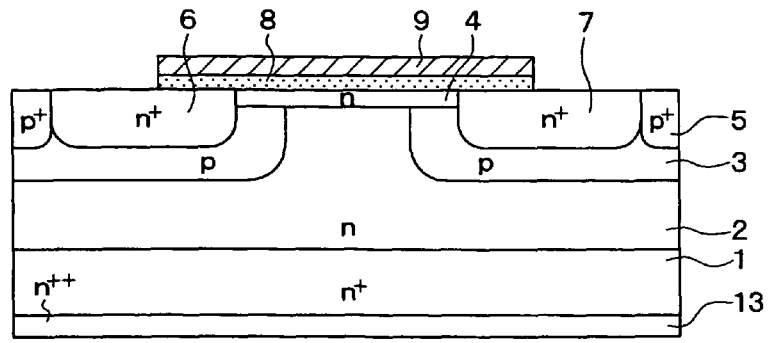
FIG. 5A to 5D are cross sectional views showing the manufacturing method for the planar MOSFET.

In a step shown in FIG. 5A, a poly silicon layer doped with the N conductive type impurity is formed on the surface of the gate oxide film 8 at 600° C. The thickness of the poly silicon layer is 440 nm. Then, a mask made of a resist film and patterned by a photo lithography method is formed, so that the poly silicon layer and the gate oxide film 8 are patterned. Thus, the gate electrode 9 is formed.

Figure 5B:
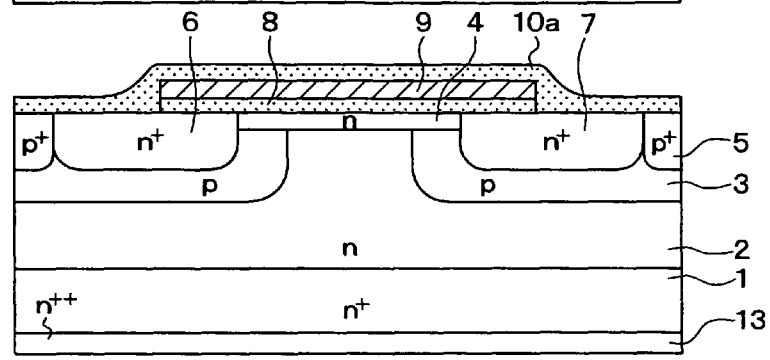

In a step shown in FIG. 5B, the BPSG insulation film 10a is formed on the whole surface of a wafer at 420° C. by a plasma CVD method or the like. The thickness of the BPSG insulation film 10a is in a range between 100 nm and 500 nm. After that, the wafer is reflowed at 930° C. for 20 minutes in wet atmosphere.

Figure 5C:
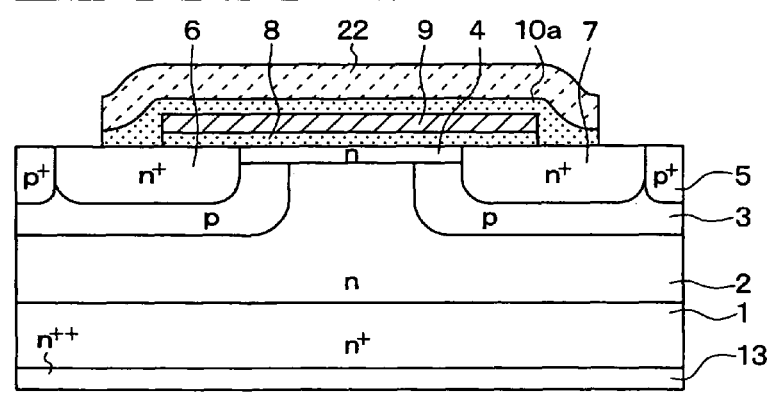

In a step shown in FIG. 5C, a resist 22 is formed on the surface of the BPSG insulation film 10a. The resist 22 is patterned by a photo lithography and etching method. By using the etched resist 22 as a mask, the BPSG insulation film 10a is etched. Thus, the first contact hole 11a for connecting to the body-P layer 5 and the N+ conductive type source regions 6, 7 is formed. Further, the second contact hole 11b for connecting to the gate electrode 9 is formed.

Figure 5D:
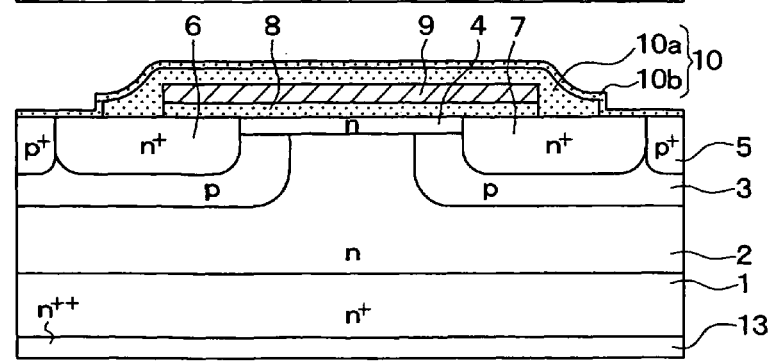

In a step shown in FIG. 5D, after the resist 22 is removed, the TEOS film 10b as a barrier layer against Ni diffusion is deposited to cover whole of the BPSG insulation film 10a including the contact holes 11a, 11b by a CVD method or the like. The thickness of the TEOS film 10b is in a range between 10 nm and a few tens nanometers.

Figure 6A:
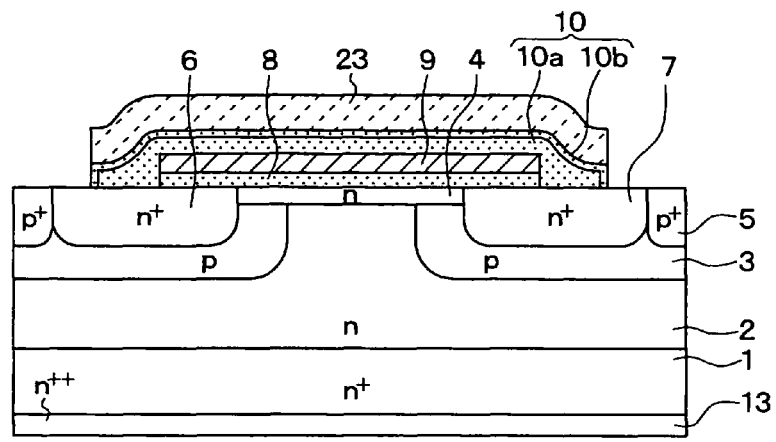
FIG. 6A to 6C are cross sectional views showing the manufacturing method for the planar MOSFET.
Figure 6B:
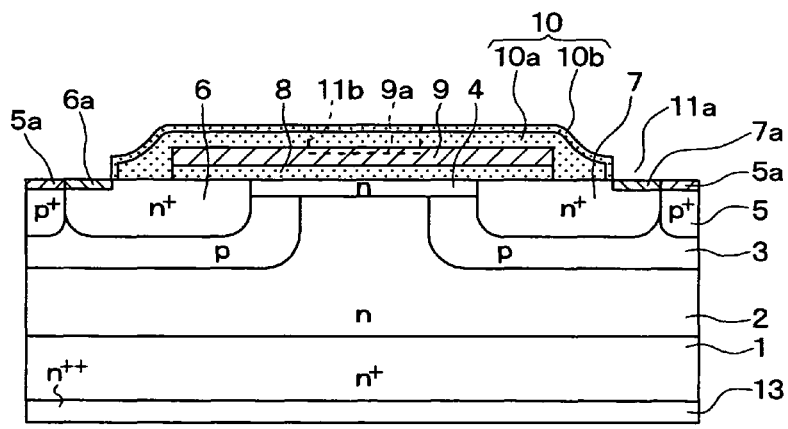

In a step shown in FIG. 6A, a second resist 23 is formed on the surface of the TEOS film 10b. The second resist 23 is patterned by a photo lithography and etching method. The TEOS film 10b is etched with using the second resist 23 as a mask, so that the contact holes 11a, 11b are formed again in the TEOS film 10b. Thus, the surface of the BPSG insulation film 10a including the sidewall of the contact holes 11a, 11b is covered with the TEOS film 10b. Accordingly, even when the source electrode 12 is formed in a latter step, the lower wiring electrode 12a in the source electrode 12 does not contact the BPSG insulation film 10a.

In a step shown in FIG. 12B, a contact metal layer (not shown) made of Ni or Ti/Ni is formed in the contact holes 11a, 11b so that the contact holes 11a, 11b are filled with the metal layer. Then, the contact metal layer is patterned, so that the body-P layer 5, the source regions 6, 7 and the gate electrode 9 are electrically coupled with the contact portions 5a, 6a, 7a, 9a.

Figure 6C:
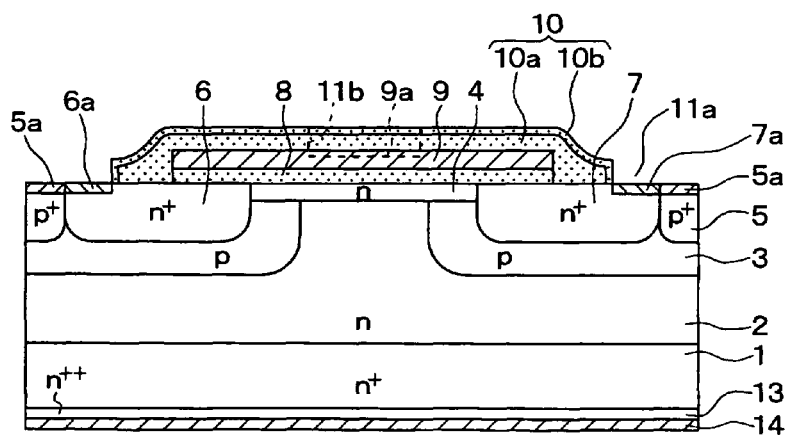
Figure 7:
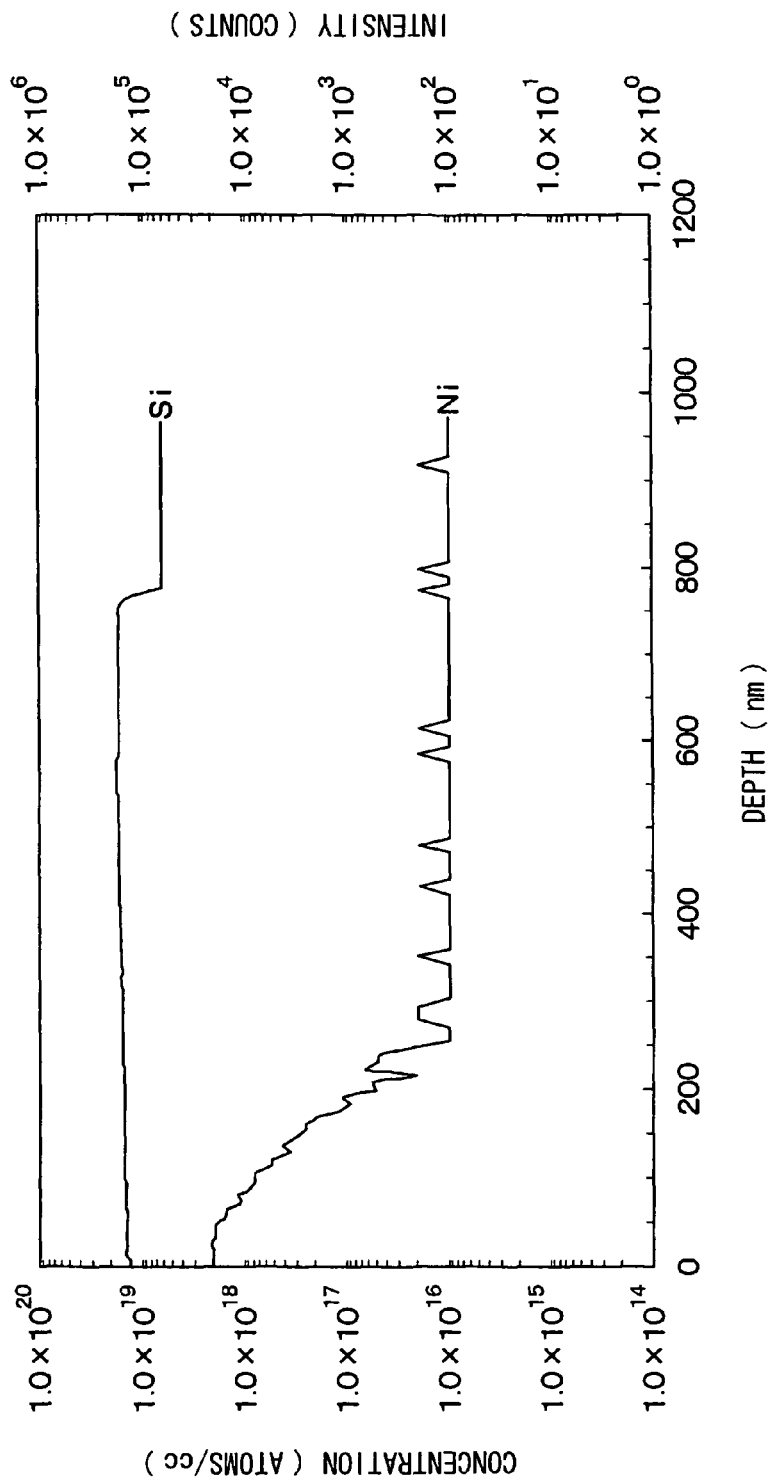
FIG. 7 is a graph showing a relationship between a depth and a concentration of Si and Ni in a BPSG insulation film, according to a related art.

In a step shown in FIG. 6C, a drain electrode 14 made of Ni is formed on the backside of the substrate 1 such that the drain contact region 13 contacts the drain electrode 14. After that, anneal process at a predetermined temperature lower than 700° C. in Ar gas atmosphere is performed so that an electrode sintering process is made. Each contact portion 5a-7a, 9a and the drain electrode 14 are coupled with ohmic contact. In this case, since the body-P layer 5, the source regions 6, 7, the gate electrode 9 and the drain contact region 13 have high impurity concentration, the ohmic contact between the contact portion 5a-7a, 9a and the drain electrode 14 is obtained without performing an anneal process with high temperature.

The lower wiring electrode 12a made of Ni is formed and patterned so that the lower wiring electrode 12a has an opening corresponding to the contact portion 5a. Further, the upper wiring electrode 12b made of Al is formed. Thus, the source electrode 12 is formed, and the gate wiring is formed. Thus, the planar MOSFET is completed.

(Modifications)

Although the device has the TEOS film 10b as the barrier film for the BPSG insulation film 10a, the device may have another film as the barrier film. For example, the barrier film may be made of an insulation film such as a nitride film or made of an oxide film such as a thermal oxidation film so that the Ni diffusion to the BPSG insulation film 10a is prevented.

Although the device includes the accumulation type planar MOSFET, the device may have a reverse type planar MOSFET, a trench gate MOSFET, or the like as long as the upper electrode made of Ni is arranged on the BPSG film. Here, the reverse type planar MOSFET has no surface channel layer 4. In case of the reverse type planar MOSFET, the step shown in FIG. 4B is replaced to a step that the N conductive type impurity ion is directly implanted to the base region 3 so that the source regions 4, 7 are formed.

Although the P conductive type impurity ion is implanted on the surface channel layer 4 so that the base region 3 is formed ion the body-P layer 5, the surface channel layer 4 may be etched so that the base region 3 is exposed. In addition, after the surface channel layer 4 is etched, the body-P layer 5 may be formed.

Here, the (11-20)-oriented surface represents one crystal surface showing a certain crystal direction. The sign of "–" in (11-20) means an over bar of "2."

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A SiC semiconductor device comprising:
   a substrate made of SiC and having first and second sides;
   a drift layer made of SiC, having a N conductive type, and disposed on the first side of the substrate;
   a base region having a P conductive type, and disposed in a surface portion of the drift layer;
   a source region made of SiC, having the N conductive type, disposed in the base region, wherein an impurity concentration of the source region is higher than the drift layer;
   a channel layer made of SiC, having the N conductive type, and disposed on the base region and the drift layer, wherein the channel layer connects the drift layer and the source region;
   a gate oxide film disposed on the channel layer and the source region;
   a gate electrode disposed on the gate oxide film;
   an interlayer insulation film disposed on the gate electrode, wherein the interlayer insulation film includes a contact hole, which connects to the base region and the source region;
   a source electrode disposed in the contact hole of the interlayer insulation film so that the source electrode is electrically coupled with the base region and the source region; and
   a drain electrode disposed on the second side of the substrate, wherein:
   the channel layer provides a channel, which is controllable with a voltage applied to the gate electrode;
   the channel provides a current flowing between the source electrode and the drain electrode through the source region, the channel and the drift layer;
   the source electrode includes a lower wiring electrode and an upper wiring electrode;
   the lower wiring electrode is made of material including a Ni component for providing ohmic contact with respect to a N conductive type semiconductor;
   the lower wiring electrode is disposed on the interlayer insulation film;
   the lower wiring electrode is electrically coupled with the source region;
   the upper wiring electrode is made of material for providing ohmic contact with respect to a P conductive type semiconductor;
   the upper wiring electrode is disposed on the lower wiring electrode;
   the upper wiring electrode is electrically coupled with the base region;
   the interlayer insulation film further includes a BPSG insulation film and a barrier layer;
   the BPSG insulation film is disposed on the gate electrode;
   the barrier layer is disposed on the BPSG insulation film and provides a sidewall of the contact hole of the interlayer insulation film;
   the lower wiring electrode is disposed on a top surface of the barrier layer;
   the barrier layer is made of a TEOS film;
   the barrier layer prevents the Ni component in the lower wiring electrode from being diffused into the BPSG insulation film; and
   the barrier layer covers a surface of the BPSG insulation film to protect the BPSG insulation film.

2. The SiC semiconductor device according to claim 1, wherein
   the barrier layer has a thickness in a range between ten nanometers and a few tens nanometers.

3. The SiC semiconductor device according to claim 1, wherein
   the BPSG insulation film has a thickness in a range between 100 nanometers and 500 nanometers.

4. The SiC semiconductor device according to claim 1, wherein
   the barrier layer covers a whole surface of the BPSG insulation film.

5. The SiC semiconductor device according to claim 1, wherein
   the upper wiring electrode contacts the base region.

6. A SiC semiconductor device comprising:
   a substrate made of SiC and having first and second sides;
   a drift layer made of SiC, having a N conductive type, and disposed on the first side of the substrate;
   a base region having a P conductive type, and disposed in a surface portion of the drift layer;
   a source region made of SiC, having the N conductive type, disposed in the base region, wherein an impurity concentration of the source region is higher than the drift layer;
   a gate oxide film disposed on the drift layer, the base region and the source region;
   a gate electrode disposed on the gate oxide film;
   an interlayer insulation film disposed on the gate electrode, wherein the interlayer insulation film includes a contact hole, which connects to the base region and the source region;

a source electrode disposed in the contact hole of the interlayer insulation film so that the source electrode is electrically coupled with the base region and the source region; and a drain electrode disposed on the second side of the substrate, wherein:

a part of the base region facing the gate electrode through the gate insulation film provides a channel, which is controllable with a voltage applied to the gate electrode;

the channel provides a current flowing between the source electrode and the drain electrode through the source region, the channel and the drift layer;

the source electrode includes a lower wiring electrode and an upper wiring electrode;

the lower wiring electrode is made of material including a Ni component for providing ohmic contact with respect to a N conductive type semiconductor;

the lower wiring electrode is disposed on the interlayer insulation film;

the lower wiring electrode is electrically coupled with the source region;

the upper wiring electrode is disposed on the lower wiring electrode;

the upper wiring electrode is electrically coupled with the base region;

the interlayer insulation film further includes a BPSG insulation film and a barrier layer;

the BPSG insulation film is disposed on the gate electrode;

the barrier layer is disposed on the BPSG insulation film and provides a sidewall of the contact hole of the interlayer insulation film;

the lower wiring electrode is disposed on a top surface of the barrier layer;

the barrier layer is made of a TEOS layer;

the barrier layer prevents the Ni component in the lower wiring electrode from being diffused into the BPSG insulation film, and the barrier layer covers a surface of the BPSG insulation film to protect the BPSG insulation film.

7. The SiC semiconductor device according to claim 6, wherein
the barrier layer has a thickness in a range between ten nanometers and a few tens nanometers.

8. The SiC semiconductor device according to claim 6, wherein
the BPSG insulation film has a thickness in a range between 100 nanometers and 500 nanometers.

9. The SiC semiconductor device according to claim 6, wherein
the barrier layer covers a whole surface of the BPSG insulation film.

10. The SiC semiconductor device according to claim 6, wherein
the upper wiring electrode contacts the base region.

11. An SiC semiconductor device comprising:
a substrate made of SiC and having first and second sides;
a drift layer made of SiC, having a N conductive type, and disposed on the first side of the substrate;
a base region having a P conductive type, and disposed in a surface portion of the drift layer;
a source region made of SiC, having the N conductive type, disposed in the base region, wherein an impurity concentration of the source region is higher than the drift layer;

a channel layer made of SiC, having the N conductive type, and disposed on the base region and the drift layer, wherein the channel layer connects the drift layer and the source region;

a gate oxide film disposed on the channel layer and the source region;

a gate electrode disposed on the gate oxide film;

an interlayer insulation film disposed on the gate electrode, wherein the interlayer insulation film includes a contact hole, which connects to the base region and the source region;

a source electrode disposed in the contact hole of the interlayer insulation film so that the source electrode is electrically coupled with the base region and the source region; and a drain electrode disposed on the second side of the substrate, wherein:

the channel layer provides a channel, which is controllable with a voltage applied to the gate electrode;

the channel provides a current flowing between the source electrode and the drain electrode through the source region, the channel and the drift layer;

the source electrode includes a lower wiring electrode and an upper wiring electrode;

the lower wiring electrode is made of material including a Ni component for providing ohmic contact with respect to a N conductive type semiconductor;

the lower wiring electrode is disposed on the interlayer insulation film;

the lower wiring electrode is electrically coupled with the source region;

the upper wiring electrode is made of material for providing ohmic contact with respect to a P conductive type semiconductor;

the upper wiring electrode is disposed on the lower wiring electrode;

the upper wiring electrode is electrically coupled with the base region;

the interlayer insulation film further includes a BPSG insulation film and a barrier layer;

the BPSG insulation film is disposed on the gate electrode;

the barrier layer is disposed on the BPSG insulation film and provides a sidewall of the contact hole of the interlayer insulation film;

the barrier layer is made of a TEOS film;

the barrier layer prevents the Ni component in the lower wiring electrode from being diffused into the BPSG insulation film;

the barrier layer covers a surface of the BPSG insulation film to protect the BPSG insulation film;

the barrier layer covers an entirety of top and side surfaces of the BPSG insulation film; and the lower wiring electrode is disposed on the interlayer insulation film so as to cover an entirety of top and side surfaces of the barrier layer.

12. The SiC semiconductor device according to claim 11, wherein
the upper wiring electrode is disposed on the lower wiring electrode so as to cover an entirety of top and side surfaces of the lower wiring electrode.

13. An SiC semiconductor device comprising:
a substrate made of SiC and having first and second sides;
a drift layer made of SiC, having a N conductive type, and disposed on the first side of the substrate;
a base region having a P conductive type, and disposed in a surface portion of the drift layer;

a source region made of SiC, having the N conductive type, disposed in the base region, wherein an impurity concentration of the source region is higher than the drift layer;

a gate oxide film disposed on the drift layer, the base region and the source region;

a gate electrode disposed on the gate oxide film;

an interlayer insulation film disposed on the gate electrode, wherein the interlayer insulation film includes a contact hole, which connects to the base region and the source region;

a source electrode disposed in the contact hole of the interlayer insulation film so that the source electrode is electrically coupled with the base region and the source region; and a drain electrode disposed on the second side of the substrate, wherein:

a part of the base region facing the gate electrode through the gate insulation film provides a channel, which is controllable with a voltage applied to the gate electrode;

the channel provides a current flowing between the source electrode and the drain electrode through the source region, the channel and the drift layer;

the source electrode includes a lower wiring electrode and an upper wiring electrode;

the lower wiring electrode is made of material including a Ni component for providing ohmic contact with respect to a N conductive type semiconductor;

the lower wiring electrode is disposed on the interlayer insulation film;

the lower wiring electrode is electrically coupled with the source region;

the upper wiring electrode is disposed on the lower wiring electrode;

the upper wiring electrode is electrically coupled with the base region;

the interlayer insulation film further includes a BPSG insulation film and a barrier layer;

the BPSG insulation film is disposed on the gate electrode;

the barrier layer is disposed on the BPSG insulation film and provides a sidewall of the contact hole of the interlayer insulation film;

the barrier layer is made of a TEOS layer;

the barrier layer prevents the Ni component in the lower wiring electrode from being diffused into the BPSG insulation film, and the barrier layer covers a surface of the BPSG insulation film to protect the BPSG insulation film;

the barrier layer covers an entirety of top and side surfaces of the BPSG insulation film; and the lower wiring electrode is disposed on the interlayer insulation film so as to cover an entirety of top and side surfaces of the barrier layer.

14. The SiC semiconductor device according to claim 13, wherein the upper wiring electrode is disposed on the lower wiring electrode so as to cover an entirety of top and side surfaces of the lower wiring electrode.

\* \* \* \* \*